(12) United States Patent
Ueno

(10) Patent No.: US 11,121,694 B2
(45) Date of Patent: Sep. 14, 2021

(54) MULTIPLEXER

(71) Applicant: Murata Manufacturing Co., Ltd., Nagaokakyo (JP)

(72) Inventor: Kouichi Ueno, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/413,640

(22) Filed: May 16, 2019

(65) Prior Publication Data

US 2019/0386631 A1    Dec. 19, 2019

(30) Foreign Application Priority Data

Jun. 19, 2018   (JP) .............................. JP2018-116333

(51) Int. Cl.

| | |
|---|---|
| H03H 9/54 | (2006.01) |
| H03H 9/70 | (2006.01) |
| H03H 7/46 | (2006.01) |
| H03F 1/56 | (2006.01) |
| H03H 9/00 | (2006.01) |
| H03H 7/01 | (2006.01) |
| H03F 3/195 | (2006.01) |

(52) U.S. Cl.
CPC ............ H03H 7/463 (2013.01); H03F 1/565 (2013.01); H03F 3/195 (2013.01); H03H 7/0161 (2013.01); H03H 9/0004 (2013.01); H03H 9/54 (2013.01)

(58) Field of Classification Search
CPC ... H03H 9/54; H03H 9/70; H04B 1/00; H04B 1/48

USPC .......................................... 333/133; 370/357
See application file for complete search history.

(56) References Cited

U.S. PATENT DOCUMENTS

| | | | | |
|---|---|---|---|---|
| 2016/0126987 | A1* | 5/2016 | Wloczysiak | .............. H03F 3/19 375/347 |
| 2016/0127029 | A1* | 5/2016 | Wloczysiak | ........... H04B 1/006 375/318 |
| 2017/0026010 | A1 | 1/2017 | Oshita | |
| 2017/0026061 | A1* | 1/2017 | Wloczysiak | ......... H04B 1/0057 |
| 2017/0244432 | A1* | 8/2017 | Ranta | ........................ H03H 7/40 |
| 2017/0302236 | A1* | 10/2017 | Oshita | ........................ H03F 1/56 |
| 2017/0317719 | A1* | 11/2017 | Mukherjee | ............ H04B 5/0062 |
| 2019/0230051 | A1* | 7/2019 | Wloczysiak | ......... H04B 1/0064 |

FOREIGN PATENT DOCUMENTS

| | | |
|---|---|---|
| JP | 2007-19918 A | 1/2007 |
| JP | 2017-17675 A | 1/2017 |

* cited by examiner

*Primary Examiner* — Dean O Takaoka
(74) *Attorney, Agent, or Firm* — Keating & Bennett, LLP

(57) ABSTRACT

A multiplexer includes a switch that individually connects or disconnects between a common terminal and first, second, third, and fourth selection terminals, first and second matching circuits, and first, second, and third filters having different pass bands. The first selection terminal is connected to one end of the first matching circuit, the second selection terminal is connected to one end of the second matching circuit, the other end of the first matching circuit and the other end of the second matching circuit are connected to each other and to one end of the first filter, the third selection terminal is connected to one end of the second filter, and the fourth selection terminal is connected to one end of the third filter.

12 Claims, 6 Drawing Sheets

| MODE | COMMUNICATION BAND | CONNECTION STATE OF SWITCH 11 | | | |
|---|---|---|---|---|---|
| | | S0-S1 | S0-S2 | S0-S3 | S0-S4 |
| 1 | B1,B3 | ON | OFF | ON | OFF |
| 2 | B1,B32 | OFF | ON | OFF | ON |

MULTIPLEXER

CROSS REFERENCE TO RELATED APPLICATIONS

This application claims the benefit of priority to Japanese Patent Application No. 2018-116333 filed on Jun. 19, 2018. The entire contents of this application are hereby incorporated herein by reference.

BACKGROUND OF THE INVENTION

1. Field of the Invention

The present invention relates to multiplexers. In particular, the present invention relates to multiplexers used for carrier aggregation.

2. Description of the Related Art

Communication devices supporting multiple frequency bands (multiband) and multiple radio systems (multimode) have been proposed. A high-frequency module that selects one signal from signals in multiple frequency bands, which are received with an antenna, and amplifies the selected signal is disclosed as an amplifier circuit used in such a communication device (for example, refer to FIG. 7 in Japanese Unexamined Patent Application Publication No. 2017-017675).

A technology called carrier aggregation (hereinafter abbreviated as CA) is in practical use in recent years. In the carrier aggregation, two or more frequency bands of the multiband are concurrently used for communication. However, in the amplifier circuit disclosed in Japanese Unexamined Patent Application Publication No. 2017-017675, circuit characteristics when two or more frequency bands are concurrently selected are not considered.

SUMMARY OF THE INVENTION

Preferred embodiments of the present invention provide multiplexers each having excellent circuit characteristics in a CA operation.

According to a preferred embodiment of the present invention, a multiplexer includes a switch that includes a common terminal, a first selection terminal, a second selection terminal, a third selection terminal, and a fourth selection terminal and that individually connects or disconnects between the common terminal and the first selection terminal, the second selection terminal, the third selection terminal, and the fourth selection terminal; a first matching circuit; a second matching circuit; a first filter; a second filter; and a third filter. The first filter, the second filter, and the third filter have different pass bands. The first selection terminal is connected to one end of the first matching circuit. The second selection terminal is connected to one end of the second matching circuit. The other end of the first matching circuit and the other end of the second matching circuit are connected to each other and are also connected to one end of the first filter. The third selection terminal is connected to one end of the second filter. The fourth selection terminal is connected to one end of the third filter.

With the multiplexer according to the present preferred embodiment, it is possible to perform the CA operation in different modes depending on the connection state of the switch, for example, in a first mode using the first filter and the second filter and a second mode using the first filter and the third filter.

In the CA operation, for example, in the case of the first filter, it is effective to make the impedance of the first filter viewed from the switch close to an open state in an out-of-band frequency of each mode of the CA operation while making the impedance of the first filter viewed from the switch close to a reference impedance, such as about 50Ω, in an in-band in order to reduce the insertion loss of the multiplexer.

However, when the out-of-band frequency of the CA operation in the first mode is greatly different from that in the second mode, it is difficult to make the impedance of the first filter viewed from the switch close to the open state in both of the two out-of-band frequencies while making the impedance of the first filter viewed from the switch close to the reference impedance in the in-band.

Accordingly, in the CA operation, the switch is connected to the first filter via one of the first matching circuit and the second matching circuit, which is appropriate for the mode, through switching with the switch. This enables the impedance in the out-of-band frequency of the first filter viewed from the switch to be close to the open state in any mode to reduce the insertion loss of the multiplexer.

As a result, it is possible to obtain multiplexers each having excellent circuit characteristics in the CA operation.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be described in detail below with reference to the accompanying drawings. The preferred embodiments described below indicate comprehensive or specific examples. Numerical values, shapes, materials, components, the arrangement of the components, the connection structure of the components, and other features and elements, which are indicated in the preferred embodiments described below, are only examples and are not intended to limit the scope of the present invention.

First Preferred Embodiment

A multiplexer according to a first preferred embodiment will now be described, taking a multiplexer that is applied to the CA using three frequency bands: a first frequency band, a second frequency band, and a third frequency band, as an example.

Figure 1:
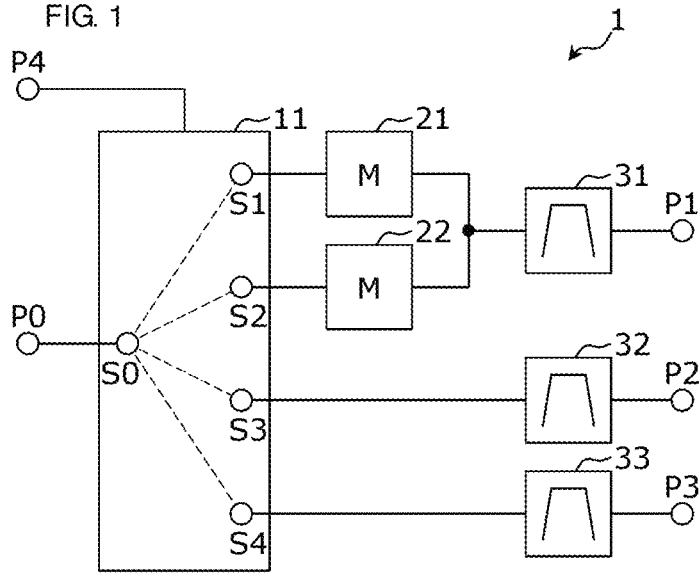
FIG. 1 is a circuit diagram illustrating an example of the configuration of a multiplexer according to a first preferred embodiment of the present invention.

FIG. 1 is a circuit diagram illustrating an example of the configuration of the multiplexer according to the first preferred embodiment. Referring to FIG. 1, a multiplexer 1 includes terminals P0, P1, P2, P3, and P4, a switch 11, matching circuits 21 and 22, and filters 31, 32, and 33.

High-frequency signals are transmitted through the terminals P0, P1, P2, and P3. A control signal used to instruct the connection state of the switch 11 is acquired through the terminal P4.

The switch 11 includes a common terminal S0 and selection terminals S1, S2, S3, and S4 and individually connects or disconnects between the common terminal S0 and the selection terminals S1, S2, S3, and S4 in accordance with the control signal acquired through the terminal P4. The switch 11 may further include another selection terminal. The selection terminals S1, S2, S3, and S4 are examples of a first selection terminal, a second selection terminal, a third selection terminal, and a fourth selection terminal, respectively.

The matching circuits 21 and 22 are impedance circuits and may preferably be, for example, elastic wave resonators. Each of the matching circuits 21 and 22 is a fixed matching circuit that includes no circuit element to intentionally change characteristics. The matching circuits 21 and 22 are examples of a first matching circuit and a second matching circuit, respectively.

Each of the filters 31, 32, and 33 is preferably a band pass filter, a high pass filter, or a low pass filter. The band pass filter, the high pass filter, and the low pass filter have a first pass band, a second pass band, and a third pass band, respectively. The filters 31, 32, and 33 are examples of a first filter, a second filter, and a third filter, respectively.

The selection terminal S1 is connected to one end of the matching circuit 21 and the selection terminal S2 is connected to one end of the matching circuit 22. The other end of the matching circuit 21 and the other end of the matching circuit 22 are connected to each other and are also connected to one end of the filter 31. The selection terminal S3 is connected to one end of the filter 32 and the selection terminal S4 is connected to one end of the filter 33.

With the above configuration, the multiplexer 1 demultiplexes and multiplexes the high-frequency signal transmitted through the terminal P0 into and with the respective high-frequency signals transmitted through the terminals P1, P2, and P3. The high-frequency signal transmitted through the terminal P0 is, for example, an antenna signal and includes signal components in multiple frequency bands. The terminal P0 is hereinafter also referred to as an antenna terminal. The high-frequency signals transmitted through the terminals P1, P2, and P3 are high-frequency signals in the first frequency band, the second frequency band, and the third frequency band, respectively, and are used in a CA operation in a combination based on the connection state of the switch 11.

The multiplexer 1 is capable of performing the CA operation in different modes depending on the connection state of the switch 11, for example, in a first mode using the filters 31 and 32 and a second mode using the filters 31 and 33.

In the CA operation, for example, in the case of the filter 31, it is effective to make the impedance of the filter 31 viewed from the switch 11 close to an open state in the second frequency band or the third frequency band (an out-of-band frequency) depending on the mode of the CA operation while making the impedance of the filter 31 viewed from the switch 11 close to reference impedance, such as about 50Ω, in the first frequency band (an in-band) in order to reduce the insertion loss of the multiplexer 1.

Accordingly, in the CA operation, the switch 11 is connected to the filter 31 via one of the matching circuits 21 and 22, which is appropriate for the mode, through switching with the switch 11. This enables the impedance in the out-of-band frequency of the filter 31 viewed from the switch 11 to be close to the open state in any mode to reduce the insertion loss of the multiplexer 1.

In order to achieve similar advantages, a variable matching circuit may be used, instead of the switching between the matching circuits 21 and 22 with the switch 11. However, since the variable matching circuit has higher insertion loss, the effect of reducing the insertion loss of the multiplexer is reduced when the variable matching circuit is used. In addition, since it is necessary to control the variable matching circuit, the target of switching is not concentrated on the switch which complicates the design.

In contrast, with the multiplexer 1, the fixed matching circuits, which are advantageous in the low loss, are used for the matching circuits 21 and 22, and the switching between the filters 31, 32, and 33 and the switching between the matching circuits 21 and 22 are performed with the switch 11 in a concentrated manner. As a result, it is possible to achieve the multiplexer 1 having excellent circuit characteristics in the CA operation while avoiding the above problems when the variable matching circuit is used.

A detailed configuration and an example of the use of the multiplexer according to the first preferred embodiment will now be described.

Figure 2:
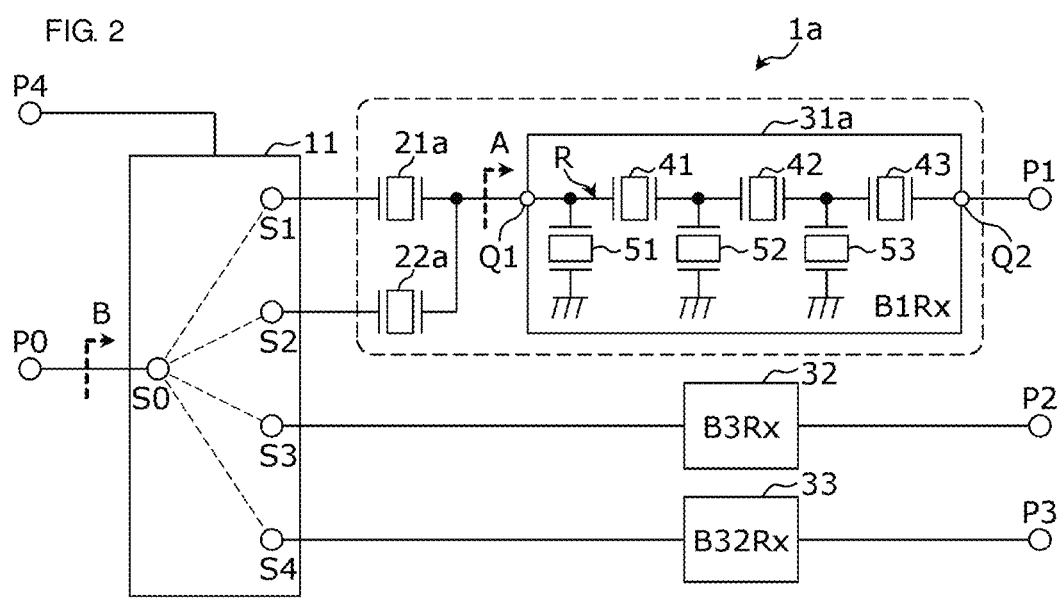
FIG. 2 is a circuit diagram illustrating an example of the detailed configuration of the multiplexer according to the first preferred embodiment of the present invention.

FIG. 2 is a circuit diagram illustrating an example of the detailed configuration of the multiplexer according to the first preferred embodiment. An example of the detailed configuration of the multiplexer and a specific example of the frequency bands that are applied and the connection state of the switch 11 are illustrated in FIG. 2. Referring to FIG. 2, in a multiplexer 1a, the matching circuits 21 and 22 and the filter 31 in the multiplexer 1 in FIG. 1 are preferably defined by, for example, elastic-wave resonators 21a and 22a and an elastic-wave filter 31a, respectively.

The elastic-wave filter 31a includes input-output ends Q1 and Q2, a signal path R between the input-output ends Q1 and Q2, first elastic-wave resonators 41, 42, and 43 defining at least a portion of the signal path R, and second elastic-wave resonators 51, 52, and 53 connected to the signal path R and ground.

The elastic-wave resonator 21a is connected to the input-output end Q1 of the elastic-wave filter 31a and the selection terminal S1 of the switch 11. The elastic-wave resonator 22a is connected to the input-output end Q1 of the elastic-wave filter 31a and the selection terminal S2 of the switch 11.

With the above configuration, the elastic-wave resonators having high Q values enable the circuit characteristics of the multiplexer 1a to be further improved. In addition, since the elastic-wave resonators 21a and 22a are capable of being provided on one piezoelectric substrate with the elastic-wave filter 31a, for example, a portion surrounded by a broken-line frame in FIG. 2 is capable of being defined by a highly functional filter chip in which the elastic-wave resonators 21a and 22a are integrated.

The multiplexer 1a is preferably applied to, for example, the CA in BandB1, BandB3, BandB32 in Long Term Evolution (LTE) (Registered trademark) defined in Third Generation Partnership Project (3GPP).

The elastic-wave filter 31a preferably includes, for example, a reception band B1Rx: about 2,110 MHz to about 2,170 MHz of BandB1 in its pass band. The filter 32 preferably includes, for example, a reception band B3Rx: about 1,805 MHz to about 1,880 MHz of BandB3 in its pass band. The filter 33 preferably includes, for example, a reception band B32Rx: about 1,452 MHz to about 1,496 MHz of BandB32 in its pass band.

The multiplexer 1a performs the CA operation in BandB1 and BandB3 (Mode 1) and the CA operation in BandB1 and BandB32 (Mode 2) in accordance with the connection state of the switch 11 illustrated in FIG. 2.

The characteristics of the multiplexer 1a will now be described based on a comparison between a preferred embodiment of the present invention and a comparative example. In the following description, the multiplexer 1a in FIG. 2 is described as the preferred embodiment and a multiplexer in which the elastic-wave resonators 21a and 22a are removed from the multiplexer 1a and the input-output end Q1 of the elastic-wave filter 31a is directly connected to the selection terminals S1 and S2 of the switch 11 is described as the comparative example (not illustrated). In the multiplexer according to the comparative example, the single impedance of the elastic-wave filter 31a is directly used.

Figure 3:
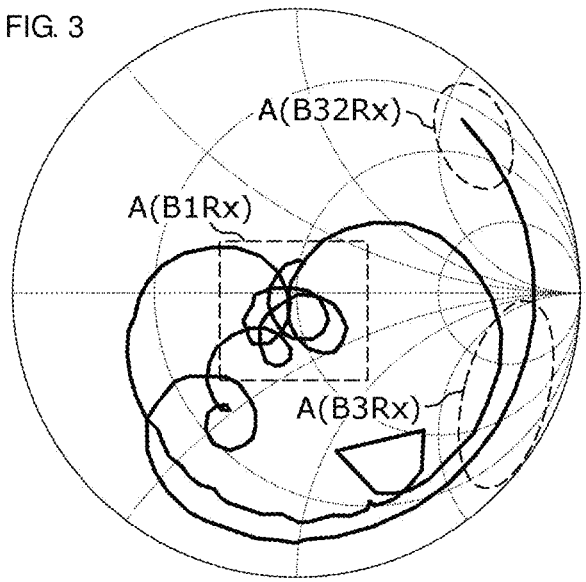
FIG. 3 is a Smith chart illustrating an example of the impedance of the simple body of a filter according to the first preferred embodiment of the present invention.

FIG. 3 is a Smith chart illustrating an example of the impedance of the simple body of the elastic-wave filter 31a. Specifically, impedance A of the elastic-wave filter 31a viewed from a point A in FIG. 2 is illustrated in FIG. 3. The elastic-wave filter 31a is adjusted so that the impedance A (B1Rx) in an in-band frequency B1Rx is close to the reference impedance, such as about 50Ω, for example. At this time, the impedance A (B3Rx) and the impedance A (B32Rx) in out-of-bands frequencies B3Rx and B32Rx are spaced apart from each other.

Figure 4:
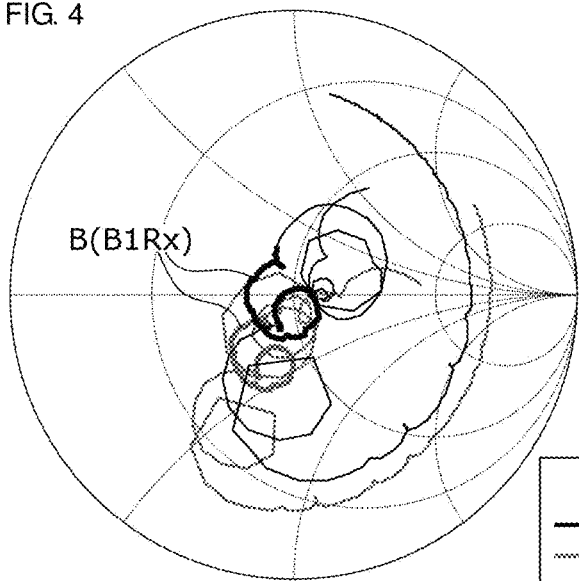
FIG. 4 is a Smith chart illustrating an example of the impedances of multiplexers viewed from an antenna terminal according to the first preferred embodiment of the present invention.

FIG. 4 is a Smith chart illustrating an example of the impedances of the multiplexers viewed from the antenna terminal. Specifically, impedance B of the multiplexer of the present preferred embodiment and the impedance B of the multiplexer of the comparative example, viewed from a point B in FIG. 2, when the switch 11 is in the connection state of Mode 1 are illustrated in FIG. 4. Referring to FIG. 4, impedance matching in the reception band B1Rx of BandB1 at the point B of the multiplexer is improved in the present preferred embodiment, compared with that in the comparative example.

Figure 5:
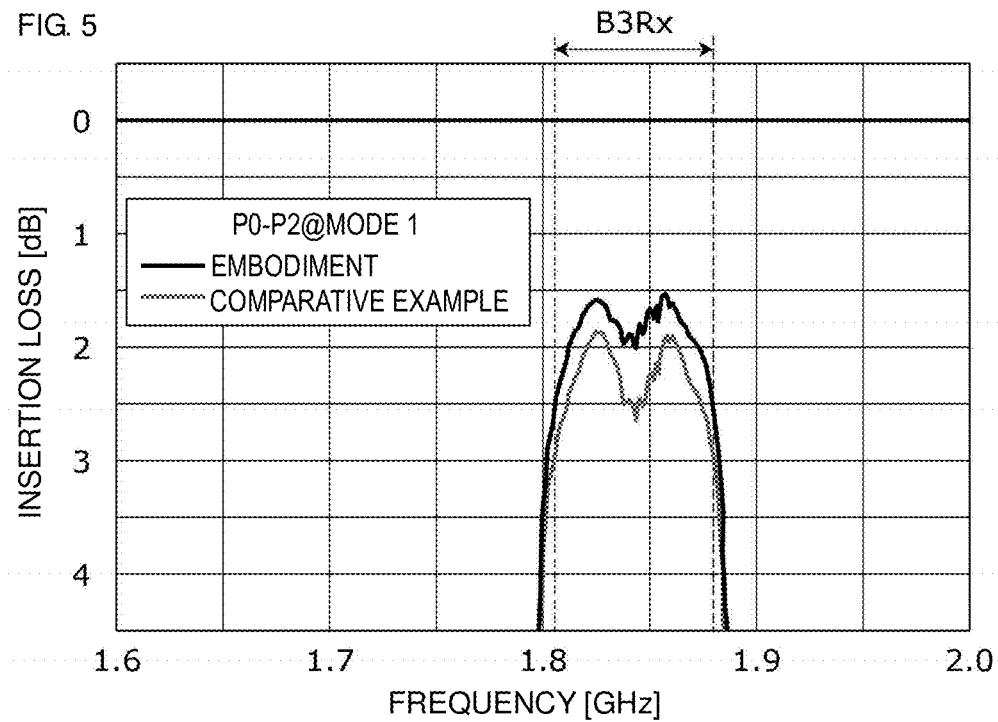
FIG. 5 is a graph illustrating an example of bandpass characteristics of the multiplexers according to the first preferred embodiment of the present invention.

FIG. 5 is a graph illustrating an example of bandpass characteristics of the multiplexers. Specifically, the bandpass characteristics between the terminals P0 and P2 of the multiplexers of the present preferred embodiment and the comparative example when the switch 11 is in the connection state of Mode 1 are illustrated in FIG. 5. Referring to FIG. 5, the insertion loss in the reception band B32Rx of BandB32 between the terminals P0 and P2 is reduced (improved) in the present preferred embodiment, compared with that in the comparative example.

FIG. 4 and FIG. 5 indicate that the characteristics in the CA operation in Mode 1 in the multiplexer 1a of the present preferred embodiment are improved, compared with those in the multiplexer of the comparative example.

Figure 6:
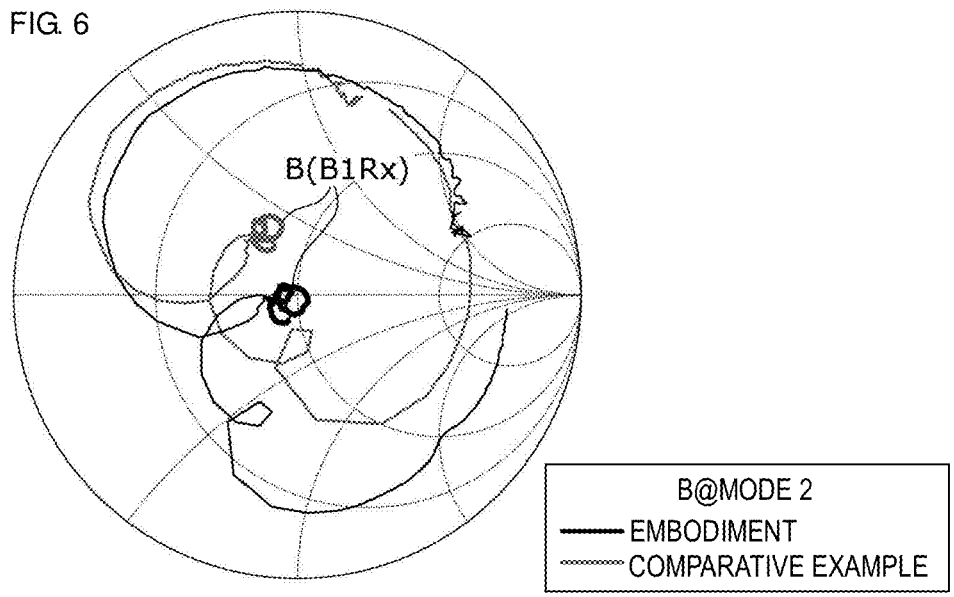
FIG. 6 is a Smith chart illustrating another example of the impedances of the multiplexers viewed from the antenna terminal according to the first preferred embodiment of the present invention.

FIG. 6 is a Smith chart illustrating another example of the impedances of the multiplexers viewed from the antenna terminal. Specifically, the impedance B of the multiplexer of the preferred embodiment and the impedance B of the multiplexer of the comparative example, viewed from the point B in FIG. 2, when the switch 11 is in the connection state of Mode 2 are illustrated in FIG. 6. Referring to FIG. 6, the impedance matching in the reception band B1Rx of BandB1 at the point B of the multiplexer is improved in the present preferred embodiment, compared with that in the comparative example.

Figure 7:
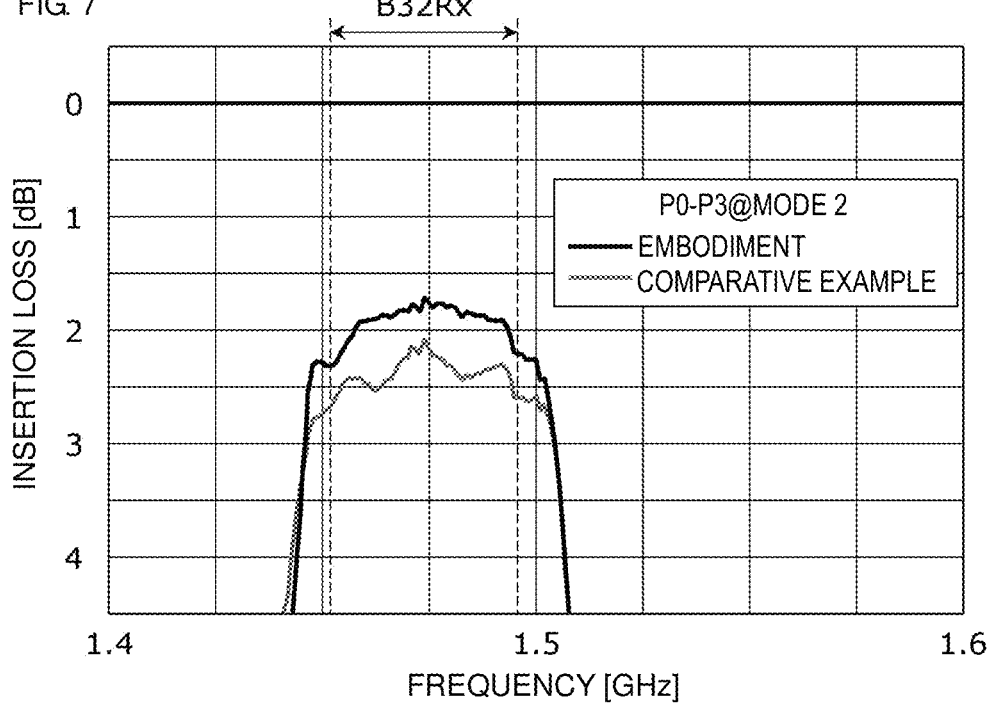
FIG. 7 is a graph illustrating another example of the bandpass characteristics of the multiplexers according to the first preferred embodiment of the present invention.

FIG. 7 is a graph illustrating another example of the bandpass characteristics of the multiplexers. Specifically, the bandpass characteristics between the terminals P0 and P3 of the multiplexers of the present preferred embodiment and the comparative example when the switch 11 is in the connection state of Mode 2 are illustrated in FIG. 7. Referring to FIG. 7, the insertion loss in the reception band B32Rx of BandB32 between the terminals P0 and P3 is reduced (improved) in the present preferred embodiment, compared with that in the comparative example.

FIG. 6 and FIG. 7 indicate that the characteristics in the CA operation in Mode 2 in the multiplexer 1a of the present preferred embodiment are improved, compared with those in the multiplexer of the comparative example.

As described above, with the multiplexer 1a, excellent circuit characteristics are achieved in the CA operations in both of Mode 1 and Mode 2.

Although BandB1, BandB3, and BandB32 in LTE (Registered trademark) are exemplified as a preferred combination of the frequency bands applied to the CA operation of the multiplexer 1a in FIG. 2, the combination of the frequency bands is not limited to this example. The multiplexer 1a is capable of performing the CA operation in a combination of three frequency bands, for example, selected from twelve frequency bands: BandB1, BandB2 (Band25), BandB4 (Band66), BandB3, BandB7, BandB40, BandB41, BandB42, BandB32, BandB21, BandB38, and BandB30. As specific examples of the combination of the frequency bands, 23 combinations including the combination of BandB1, BandB3, and BandB32 illustrated in FIG. 2 are listed in Table 1.

TABLE 1

| B01-B03-B40 | B01-B07-B40 | B01-B03-B07 |
| B01-B03-B07 | B01-B41-B42 | B01-B03-B40 |
| B01-B03-B42 | B02-B07-B66 | B01-B03-B42 |
| B01-B21-B42 | B03-B07-B32 | B01-B03-B32 |
| B2(25)-B4(66)-B07 | B03-B07-B40 | B01-B41-B42 |
| B2(25)-B4(66)-B30 | B01-B07-B42 | B03-B07-B40 |
| B01-B03-B38 | B03-B07-B42 | B03-B41-B42 |
| B01-B03-B41 | B01-B03-B42 | |

Second Preferred Embodiment

A multiplexer according to a second preferred embodiment of the present invention will now be described.

Figure 8:
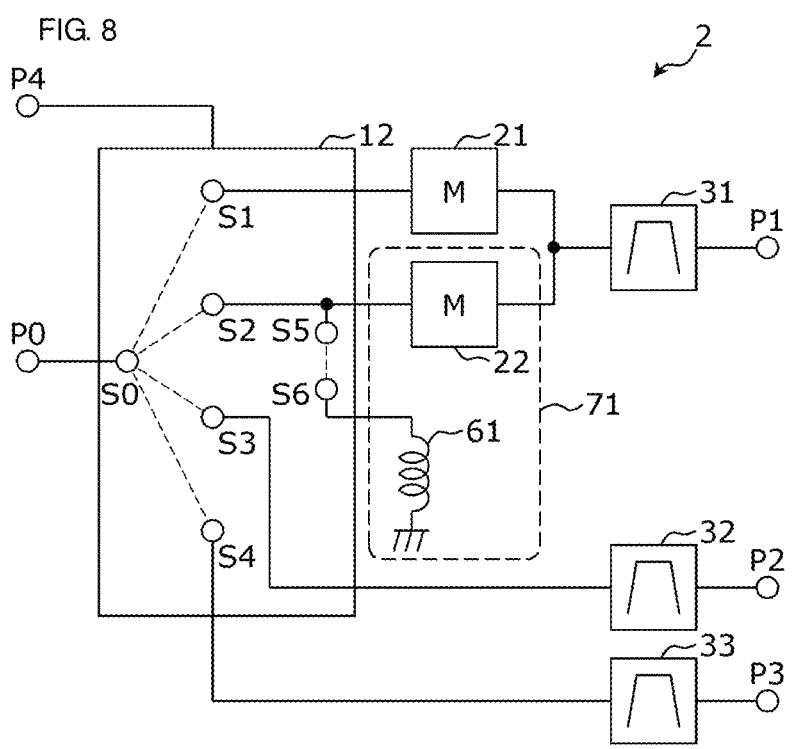
FIG. 8 is a circuit diagram illustrating an example of the configuration of a multiplexer according to a second preferred embodiment of the present invention.

FIG. 8 is a circuit diagram illustrating an example of the configuration of the multiplexer according to the second preferred embodiment. Referring to FIG. 8, a multiplexer 2 differs from the multiplexer 1 in FIG. 1 in that the switch 11 is changed to a switch 12 and an inductor 61 is included. The same reference numerals are used in the second preferred embodiment to identify the same or similar components described in the first preferred embodiment and a description of such components is appropriately omitted herein.

The switch 12 includes additional terminals S5 and S6, in addition to the common terminal S0 and the selection terminals S1, S2, S3, and S4, which are common to the switch 11. The additional terminal S5 is connected to the selection terminal S2. The switch 12 connects the additional terminal S5 to the additional terminal S6 or disconnects the additional terminal S5 from the additional terminal S6. In other words, the switch 12 connects the selection terminal S2 to the additional terminal S6 or disconnects the selection terminal S2 from the additional terminal S6 via the additional terminal S5. The common terminal S0 is connected to or disconnected from the respective selection terminals S1, S2, S3, and S4, as in the switch 11.

The additional terminal S6 is grounded via the inductor 61. The inductor 61 defines a resonant circuit 71 with a capacitance component of the matching circuit 22 in a state in which the additional terminal S5 is connected to the additional terminal S6. When the resonant circuit 71 is defined by an inductance component of the matching circuit 22, the inductor 61 is changed to a capacitor.

The additional terminal S6 is an example of a first additional terminal and the inductor 61 is an example of a first reactance element.

With the multiplexer 2, since an attenuation pole is provided by the resonant circuit 71 in which the inductor 61 is coupled to the matching circuit 22 via the switch 12, attenuation characteristics outside the pass band of the filter 31 are capable of being improved using the attenuation pole.

Although the additional terminals S5 and S6 are connected to the selection terminal S2 in FIG. 8, the connection of the additional terminals S5 and S6 is not limited to this example. For example, other additional terminals corresponding to the additional terminals S5 and S6 and another inductor corresponding to the inductor 61 may be connected to the selection terminal S1 (not illustrated).

With the above configuration, since another attenuation pole is provided by a resonant circuit in which the other inductor is coupled to the matching circuit 21 via the switch 12, selectively using the two attenuation poles enables the attenuation characteristics outside the pass band of the filter 31 to be adjusted to, for example, attenuation necessary for each mode of the CA operation.

A detailed configuration and an example of the use of the multiplexer according to the second preferred embodiment will now be described.

Figure 9:
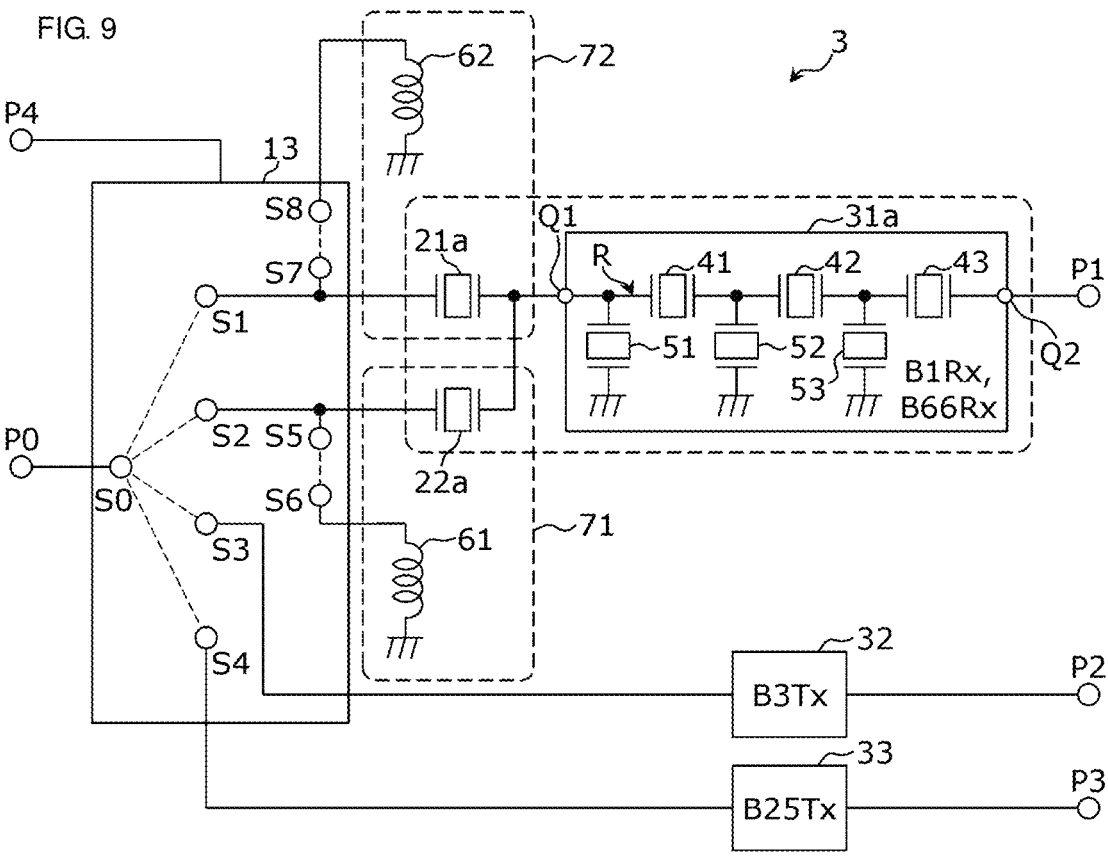
FIG. 9 is a circuit diagram illustrating an example of the detailed configuration of the multiplexer according to the second preferred embodiment of the present invention.

FIG. 9 is a circuit diagram illustrating an example of the detailed configuration of the multiplexer according to the second preferred embodiment. An example of the detailed configuration of the multiplexer and a specific example of the frequency bands that are applied and the connection state of a switch 13 are illustrated in FIG. 9. Referring to FIG. 9, in a multiplexer 3, additional terminals S7 and S8 and an inductor 62 are added to the multiplexer 2 in FIG. 8 so as to be connected to the selection terminal S1. In addition, the matching circuits 21 and 22 and the filter 31 are preferably defined by, for example, the elastic-wave resonators 21a and 22a and the elastic-wave filter 31a, respectively.

The multiplexer 3 is preferably applied to, for example, the CA in BandB1, BandB3, BandB25, and BandB66 in LTE (Registered trademark). A reception signal in BandB1 and a reception signal in Band66 are processed in the elastic-wave filter 31a due to the reception band B1Rx of BandB1 being overlapped with a reception band B66Rx of BandB66.

The elastic-wave filter 31a preferably includes, for example, both of the reception band B1Rx: about 2,110 MHz to about 2,170 MHz of BandB1 and the reception band B66Rx: about 2,110 MHz to about 2,200 MHz of BandB66 in its pass band. The filter 32 preferably includes, for example, a transmission band B3Tx: about 1,710 MHz to about 1,785 MHz of BandB3 in its pass band. The filter 33 preferably includes, for example, a transmission band B25Tx: about 1,850 MHz to about 1,915 MHz of BandB25 in its pass band.

In addition to the above filters, filters that process a transmission band B1Tx of BandB1, a transmission band B66Tx of BandB66, the reception band B3Rx of BandB3, and a reception band B25Rx of BandB25 are provided in the multiplexer 3, although the filters are not illustrated in FIG. 9.

The multiplexer 3 performs the CA operation in BandB1 and BandB3 (Mode 3) and the CA operation in BandB25 and BandB66 (Mode 4) in accordance with the connection state of the switch 13 illustrated in FIG. 9.

With the multiplexer 3, the circuit characteristics in the CA operation are capable of being improved by switching between the elastic-wave resonators 21a and 22a, as in the multiplexer 1a. In addition, with the multiplexer 3, the attenuation is capable of being adjusted in different manners with the resonant circuit 71 and a resonant circuit 72 in the CA operation in Mode 3 and the CA operation in Mode 4, respectively.

Figure 10:
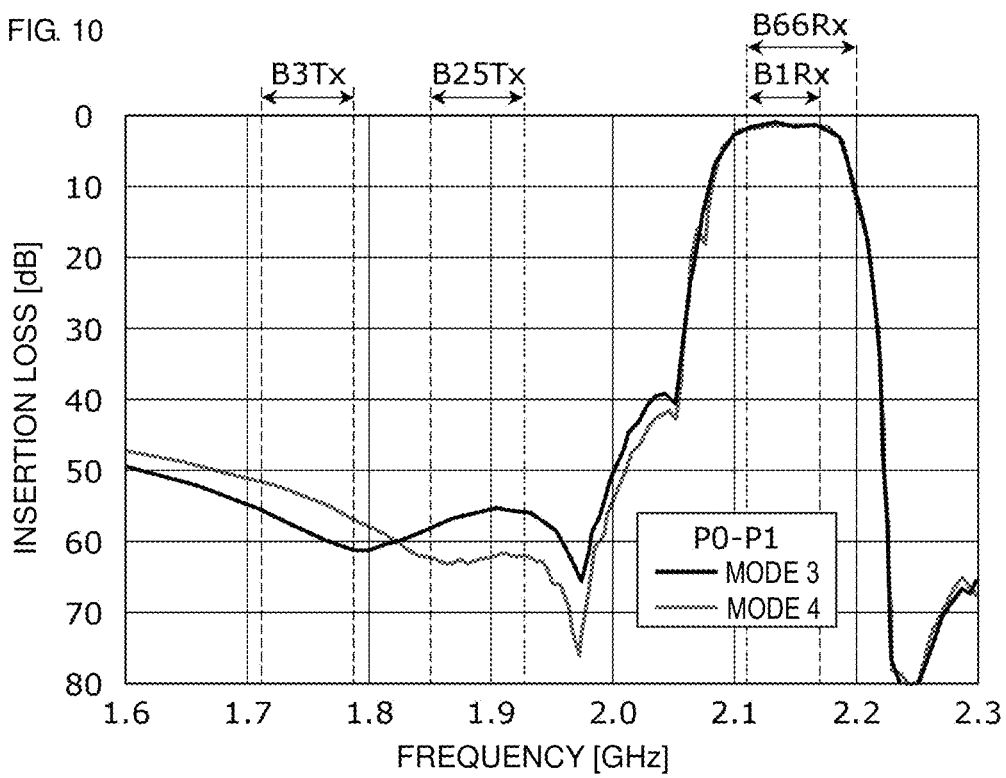
FIG. 10 is a graph illustrating an example of the bandpass characteristics of the multiplexer according to the second preferred embodiment of the present invention.

FIG. 10 is a graph illustrating an example of bandpass characteristics of the multiplexer 3. Specifically, the bandpass characteristics between the terminals P0 and P1 of the multiplexer 3 when the switch 13 is in the connection state of Mode 3 and when the switch 13 is in the connection state of Mode 4 are illustrated in FIG. 10.

Referring to FIG. 10, in Mode 3 (the CA in BandB1 and BandB3), larger attenuation is provided in the transmission band B3Tx of BandB3, compared with that in Mode 4. In Mode 4 (the CA in BandB25 and BandB66), larger attenuation is provided in the transmission band B25Tx of BandB25, compared with that in Mode 3. The loss in the pass band including the reception band B1Rx of BandB1 and the reception band B66Rx of BandB66 is effectively maintained in both of Mode 3 and Mode 4.

As described above, since different attenuation poles are capable of being provided with the two resonant circuits 71 and 72 in the multiplexer 3, selectively using the two attenuation poles enables the attenuation characteristics outside the pass band of the filter 31 to be adjusted to attenuation necessary for each out-of-band frequency of the CA operation.

The frequency bands for commonly using the filters are not limited to the combination of the reception band B1Rx of BandB1 and the reception band B66Rx of BandB66. For example, the transmission band B66Tx: about 1,710 MHz to about 1,780 MHz of BandB66 is overlapped with the transmission band B3Tx of BandB3. Accordingly, a transmission signal in BandB3 and a transmission signal in BandB66 may be processed in the filter 32.

Although the multiplexers according to the preferred embodiments of the present invention are described above, the present invention is not limited to the respective preferred embodiments. Modifications resulting from making various changes conceived by the persons skilled in the art to the above-described preferred embodiments without departing from the scope and sprit of the present invention and preferred embodiments obtained by combining components in the different preferred embodiments may be included in other preferred embodiments of the present invention.

A multiplexer according to a preferred embodiment of the present invention includes a switch that includes a common terminal, a first selection terminal, a second selection terminal, a third selection terminal, and a fourth selection terminal and that individually connects or disconnects between the common terminal and the first selection terminal, the second selection terminal, the third selection terminal, and the fourth selection terminal; a first matching circuit; a second matching circuit; a first filter; a second filter; and a third filter. The first filter, the second filter, and the third filter have different pass bands. The first selection terminal is connected to one end of the first matching circuit. The second selection terminal is connected to one end of the second matching circuit. The other end of the first matching circuit and the other end of the second matching circuit are connected to each other and are also connected to one end of the first filter. The third selection terminal is connected to one end of the second filter. The fourth selection terminal is connected to one end of the third filter.

With the above configuration, the multiplexer is capable of performing the CA operation in different modes depending on the connection state of the switch, for example, in a first mode using the first filter and the second filter and a second mode using the first filter and the third filter.

In the CA operation, the impedance of the first filter viewed from the switch is close to an open state in the out-of-band frequency of each mode of the CA operation while making the impedance of the first filter viewed from the switch close to the reference impedance, such as about 50Ω, for example, in the in-band frequency in order to reduce the insertion loss of the multiplexer. However, when the out-of-band frequency of the CA operation in the first mode is greatly different from that in the second mode, it is difficult to make the impedance of the first filter viewed from the switch close to the open state in both of the two out-of-band frequencies while making the impedance of the first filter viewed from the switch close to the reference impedance in the in-band frequency.

Accordingly, in the CA operation, the switch is connected to the first filter via one of the first matching circuit and the second matching circuit, which is appropriate for the mode, through switching with the switch. This enables the impedance in the out-of-band frequency of the first filter viewed from the switch to be close to the open state in any mode to reduce the insertion loss of the multiplexer.

In order to achieve similar advantages, a variable matching circuit may be used, instead of the switching between the matching circuits with the switch. However, since the variable matching circuit may have high insertion loss, the effect of reducing the insertion loss of the multiplexer is reduced when the variable matching circuit is used. In addition, since it is necessary to control the variable matching circuit, the target of switching is not concentrated on the switch which complicates the design.

In contrast, with the above configuration, the fixed matching circuits are used for the first matching circuit and the second matching circuit, and the switching between the filters and the switching between the matching circuits are performed with one switch in a concentrated manner. As a result, it is possible to obtain the multiplexer having excellent circuit characteristics in the CA operation while avoiding the above problems when the variable matching circuit is used.

The first filter may preferably be, for example, an elastic-wave filter including a pair of input-output ends, a signal path between the pair of input-output ends, a first elastic-wave resonator defining at least a portion of the signal path, and a second elastic-wave resonator connected to the signal path and ground. The first matching circuit may preferably be, for example, a third elastic-wave resonator connected to the input-output end closer to the switch, in the pair of input-output ends of the first filter, and the first selection terminal. The second matching circuit may preferably be, for example, a fourth elastic-wave resonator connected to the input-output end closer to the switch, in the pair of input-output ends of the first filter, and the second selection terminal.

With the above configuration, using the elastic-wave resonators having high Q values enables the circuit characteristics of the multiplexer to be further improved. In addition, since the first matching circuit and the second matching circuit are capable of being provided on one piezoelectric substrate with the first filter, a highly functional filter chip in which the first matching circuit and the second matching circuit are integrated is achieved.

A pass band of the first filter may be higher or lower than both of a pass band of the second filter and a pass band of the third filter.

With the above configuration, since the impedances in the two out-of-band frequencies of the first filter viewed from the switch are at positions rotating in the same direction from the impedance in the in-band frequency on the Smith chart, the impedances in the two out-of-band frequencies of the first filter viewed from the switch are not concentrated at the same position. Accordingly, it is difficult to make the impedance of the first filter viewed from the switch close to the open state in both of the two out-of-band frequencies while making the impedance of the first filter viewed from the switch close to the reference impedance in the in-band frequency.

Even in such a case, excellent circuit characteristics are capable of being achieved in the CA operation by connecting the switch to the first filter via one of the first matching circuit and the second matching circuit, which is appropriate for the mode, through switching with the switch.

A gap between a pass band of the second filter and a pass band of the third filter may be wider than a narrower gap, among a gap between a pass band of the first filter and the pass band of the second filter and a gap between the pass band of the first filter and the pass band of the third filter.

With the above configuration, the impedances in the two out-of-band frequencies of the first filter viewed from the switch are greatly spaced apart from each other on the Smith chart. Accordingly, it is difficult to make the impedance of the first filter viewed from the switch close to the open state in both of the two out-of-band frequencies while making the impedance of the first filter viewed from the switch close to the reference impedance in the in-band frequency.

Even in such a case, excellent circuit characteristics are capable of being achieved in the CA operation by connecting the switch to the first filter via one of the first matching circuit and the second matching circuit, which is appropriate for the mode, through switching with the switch.

The switch may preferably further include a first additional terminal and may connect or disconnect between either of the first selection terminal and the second selection terminal and the first additional terminal. The first additional terminal may be grounded via a first reactance element.

With the above configuration, a first resonant circuit is capable of being defined by coupling the first reactance element to the first matching circuit or the second matching circuit via the switch. The first resonant circuit defines an attenuation pole. Using the attenuation pole enables the attenuation characteristics outside the pass band of the first filter to be improved.

The switch may preferably further include a second additional terminal and may connect or disconnect between the remaining selection terminal of the first selection terminal and the second selection terminal and the second additional terminal. The second additional terminal may be grounded via a second reactance element.

With the above configuration, a second resonant circuit including the second reactance element is capable of being provided with the first resonant circuit using the first reactance element. The second resonant circuit defines an attenuation pole different from the attenuation pole defined by the first resonant circuit. Selectively using the two attenuation poles enables the attenuation characteristics outside the pass band of the first filter to be adjusted to, for example, attenuation necessary for each mode of the CA operation.

Preferred embodiments of the present invention are each capable of being widely used in communication devices, such as mobile phones, for example, as the multiplexer supporting multiband and multimode functions.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multiplexer comprising:
a switch that includes a common terminal, a first selection terminal, a second selection terminal, a third selection terminal, and a fourth selection terminal, and individually connects or disconnects between the common terminal and the first selection terminal, the second selection terminal, the third selection terminal, and the fourth selection terminal;
a first matching circuit;
a second matching circuit;
a first filter;
a second filter; and
a third filter; wherein
the first filter, the second filter, and the third filter have different pass bands;
the first selection terminal is connected to one end of the first matching circuit;
the second selection terminal is connected to one end of the second matching circuit;
another end of the first matching circuit and another end of the second matching circuit are connected to each other and to one end of the first filter;
the third selection terminal is connected to one end of the second filter; and
the fourth selection terminal is connected to one end of the third filter.

2. The multiplexer according to claim 1, wherein
the first filter is an elastic-wave filter including a pair of input-output ends, a signal path between the pair of input-output ends, a first elastic-wave resonator defining at least a portion of the signal path, and a second elastic-wave resonator connected to the signal path and to a ground;
the first matching circuit is a third elastic-wave resonator connected to an input-output end closer to the switch, of the pair of input-output ends of the first filter, and the first selection terminal; and
the second matching circuit is a fourth elastic-wave resonator connected to the input-output end closer to the switch, of the pair of input-output ends of the first filter, and the second selection terminal.

3. The multiplexer according to claim 1, wherein the pass band of the first filter is higher or lower than both of the pass band of the second filter and the pass band of the third filter.

4. The multiplexer according to claim 1, wherein a gap between the pass band of the second filter and the pass band of the third filter is wider than a narrower gap, among a gap between the pass band of the first filter and the pass band of the second filter and a gap between the pass band of the first filter and the pass band of the third filter.

5. The multiplexer according to claim 1, wherein
the switch further includes a first additional terminal and connects or disconnects between either of the first selection terminal and the second selection terminal and the first additional terminal; and
the first additional terminal is grounded via a first reactance element.

6. The multiplexer according to claim 5, wherein
the switch further includes a second additional terminal and connects or disconnects between a remaining selection terminal of the first selection terminal and the second selection terminal and the second additional terminal; and
the second additional terminal is grounded via a second reactance element.

7. The multiplexer according to claim 1, wherein each of the first, second, and third filters is one of a band pass filter, a high pass filter, or a low pass filter.

8. The multiplexer according to claim 1, wherein each of the first and second matching circuits is a fixed matching circuit.

9. The multiplexer according to claim 1, wherein
the first filter includes a reception band of about 2,110 MHz to about 2,170 MHz;
the second filter includes a reception band of about 1,805 MHz to about 1,880 MHz; and
the third filter includes a reception band of about 1,452 MHz to about 1,496 MHz.

10. The multiplexer according to claim 5, wherein the first reactance element is an inductor.

11. The multiplexer according to claim 6, wherein the second reactance element is an inductor.

12. The multiplexer according to claim 1, wherein
the first filter includes a reception band of about 2,110 MHz to about 2,170 MHz of BandB1 and the reception band of about 2,110 MHz to about 2,200 MHz;
the second filter includes a transmission band of about 1,710 MHz to about 1,785 MHz; and
the third filter includes a transmission band of about 1,850 MHz to about 1,915 MHz.

* * * * *